United States Patent
Vinayak

(10) Patent No.: US 9,263,997 B2
(45) Date of Patent: Feb. 16, 2016

(54) SELF SETTING POWER SUPPLY USING NEGATIVE OUTPUT IMPEDANCE

(71) Applicant: Quantance, Inc., San Mateo, CA (US)

(72) Inventor: Vikas Vinayak, Menlo Park, CA (US)

(73) Assignee: QUANTANCE, INC., Woburn, MA (US)

( * ) Notice: Subject to any disclaimer, the term of this patent is extended or adjusted under 35 U.S.C. 154(b) by 0 days.

(21) Appl. No.: 14/207,285

(22) Filed: Mar. 12, 2014

(65) Prior Publication Data
US 2014/0266426 A1    Sep. 18, 2014

Related U.S. Application Data

(60) Provisional application No. 61/784,577, filed on Mar. 14, 2013.

(51) Int. Cl.
| | |
|---|---|
| *H03G 3/30* | (2006.01) |
| *H03F 3/20* | (2006.01) |
| *H03F 3/189* | (2006.01) |
| *H03F 3/24* | (2006.01) |
| *H03F 1/02* | (2006.01) |

(52) U.S. Cl.
CPC .............. *H03F 3/189* (2013.01); *H03F 1/0233* (2013.01); *H03F 3/245* (2013.01); *H03F 2200/555* (2013.01)

(58) Field of Classification Search
CPC ............ H03F 1/0211; H03F 3/20; H03G 3/30
USPC .................................. 330/127, 297, 285, 296
See application file for complete search history.

(56) References Cited

U.S. PATENT DOCUMENTS

| | | | | |
|---|---|---|---|---|
| 4,152,670 | A  * | 5/1979 | Rimondini et al. | ............. 331/61 |
| 7,395,038 | B2 * | 7/2008 | McCune | ..................... 455/127.1 |
| 7,551,032 | B2 * | 6/2009 | Dupuis et al. | .................. 330/285 |
| 7,741,903 | B2 * | 6/2010 | Vinayak et al. | ................. 330/127 |
| 8,344,806 | B1 * | 1/2013 | Franck et al. | .................. 330/285 |
| 2009/0191826 | A1 * | 7/2009 | Takinami et al. | ............. 455/110 |

* cited by examiner

*Primary Examiner* — Henry Choe
(74) *Attorney, Agent, or Firm* — Lando & Anastasi, LLP

(57) ABSTRACT

A self-setting power supply monitors a supply current drawn by a power amplifier and sets a supply voltage based on the supply current to achieve efficient power operation. In order to maintain operation of the power amplifier above minimum operating conditions, the self-setting power supply sets the supply voltage to the minimum operating voltage when the supply current drops below a threshold bias current. When the supply current is above the threshold bias current, the self-setting power supply adjusts the supply voltage approximately proportionally to the supply current to maintain approximately constant gain of the power amplifier.

19 Claims, 7 Drawing Sheets

SELF SETTING POWER SUPPLY USING NEGATIVE OUTPUT IMPEDANCE

CROSS-REFERENCE TO RELATED APPLICATIONS

This application claims the benefit of U.S. Provisional Patent Application No. 61/784,577 filed on Mar. 14, 2013 entitled "Self Setting Power Supply Using Negative Output Impedance," to Vikas Vinayak, the contents of which are incorporated by reference herein.

BACKGROUND

1. Field of Technology

Embodiments disclosed herein relate to power supplies, and more specifically to a self setting power supply using negative output impedance.

2. Description of the Related Arts

Most power supplies deliver a desired voltage to a client circuit. This desired voltage (or "set point") may either be static or can be dynamically controlled. For example, in power supplies for application processors in smartphones or other digital circuits, the processor may control the power supply voltage to be lower or higher depending on the computational workload or desired speed. In envelope tracking applications, a radio frequency (RF) transceiver or digital baseband circuit may control the set point of a power supply based on the instantaneous RF power being delivered by an RF power amplifier.

In a conventional radio frequency power amplifier system, the RF output power generally increases as the amplitude of RF input signal to the power amplifier increases. For power efficient operation, an envelope tracking technique may be used in which the supply voltage to the RF power amplifier is adjusted based on the amplitude of the RF input signal to ensure that the appropriate instantaneous power is delivered to the load in a power efficient manner. For example, a power supply controller may adjust the supply voltage to the minimum supply voltage that will still enable the power amplifier to achieve the appropriate instantaneous output power. However, conventional systems that utilize dynamically controlled set points still fail to optimize efficiency of the power supply.

SUMMARY

Embodiments include a power amplifier system and a power supply for providing power to a power amplifier. In an embodiment, a power amplifier amplifies a radio frequency (RF) input signal and generates an RF output signal. The power amplifier receives a supply voltage and draws a supply current based on an amplitude of the RF output signal. A power supply receives a voltage control signal and provides the supply voltage and the supply current to the power amplifier based on the voltage control signal. The voltage control signal controls the power supply to increase the supply voltage responsive to detecting an increase in the supply current when the supply current is above a predefined threshold current, and to decrease the supply voltage responsive to detecting a decrease in the supply current when the supply current is above the predefined threshold current.

In one embodiment, the power supply is further configured to output a predefined minimum voltage as the supply voltage responsive to detecting that the supply current is below the predefined threshold current.

In one embodiment, the power supply operates with a substantially constant gain when the supply current is above the predefined threshold current. Furthermore, in one embodiment, the power supply operates with a negative output impedance.

The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter

BRIEF DESCRIPTION OF THE DRAWINGS

The teachings of the embodiments disclosed herein can be readily understood by considering the following detailed description in conjunction with the accompanying drawings.

DETAILED DESCRIPTION

The Figures (FIG.) and the following description relate to various embodiments by way of illustration only. It should be noted that from the following discussion, alternative embodiments of the structures and methods disclosed herein will be readily recognized as viable alternatives that may be employed without departing from the principles discussed herein.

Reference will now be made in detail to several embodiments, examples of which are illustrated in the accompanying figures. It is noted that wherever practicable similar or like reference numbers may be used in the figures and may indicate similar or like functionality. The figures depict various embodiments for purposes of illustration only. One skilled in the art will readily recognize from the following description that alternative embodiments of the structures and methods illustrated herein may be employed without departing from the principles described herein.

A self-setting power supply monitors a supply current drawn by a power amplifier and sets a supply voltage based on the supply current to achieve efficient power operation. In contrast to conventional envelope tracking techniques, the self-setting power supply does not necessarily need to monitor the amplitude of the RF input signal to the power amplifier to determine the desired supply voltage. Instead, by setting the supply voltage based on the monitored supply current, the self-setting power supply can achieve optimal or near optimal power efficiency for a given output power.

Figure 1:
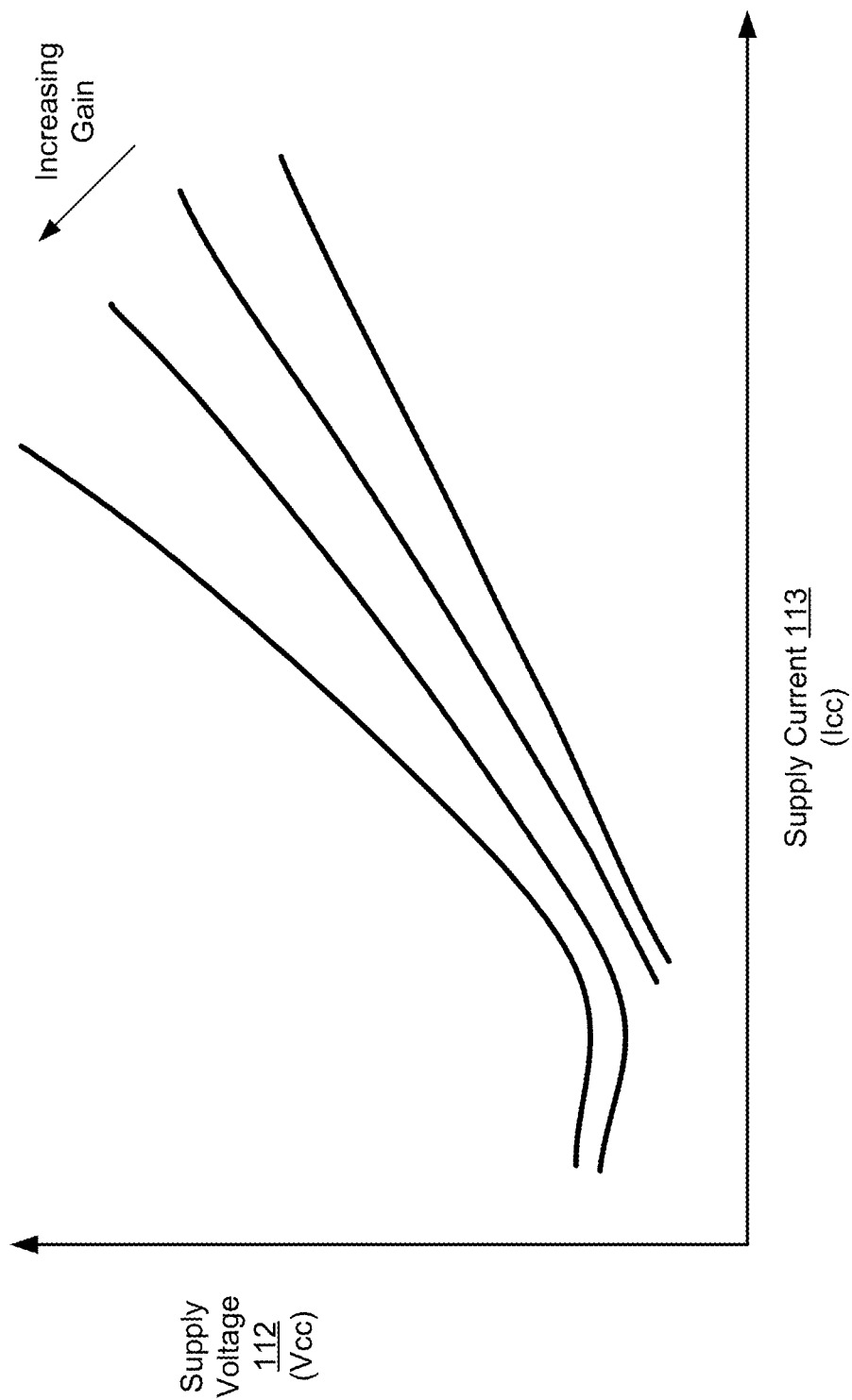
FIG. 1 is a plot illustrating the relationship between supply voltage and supply current for different constant gains of an example power amplifier in accordance with one embodiment.

Linearity is generally a desired characteristic of a power amplifier. In linear operation of a power amplifier, the output voltage of the power amplifier is in constant proportion to the input voltage of the power amplifier over a desired range of input voltages. Thus, the power amplifier has a constant gain. FIG. 1 illustrates a series of constant gain curves illustrating the relationship between supply voltage 112 and supply current 113 for different constant gains of an example power amplifier. Each of the different constant gain curves has a minimum voltage and a minimum bias current for the power amplifier to operate at that particular gain, and these values may vary for different gains. Furthermore, above these minimum voltage and current conditions, the supply voltage 112 generally rises approximately linearly with increasing supply current 113 to maintain constant gain. The gain is related to the rate of change of the supply voltage 112 as a function of supply current 113. Particularly, the slopes of the supply voltage-supply current curves increase with increasing gain.

Figure 2:
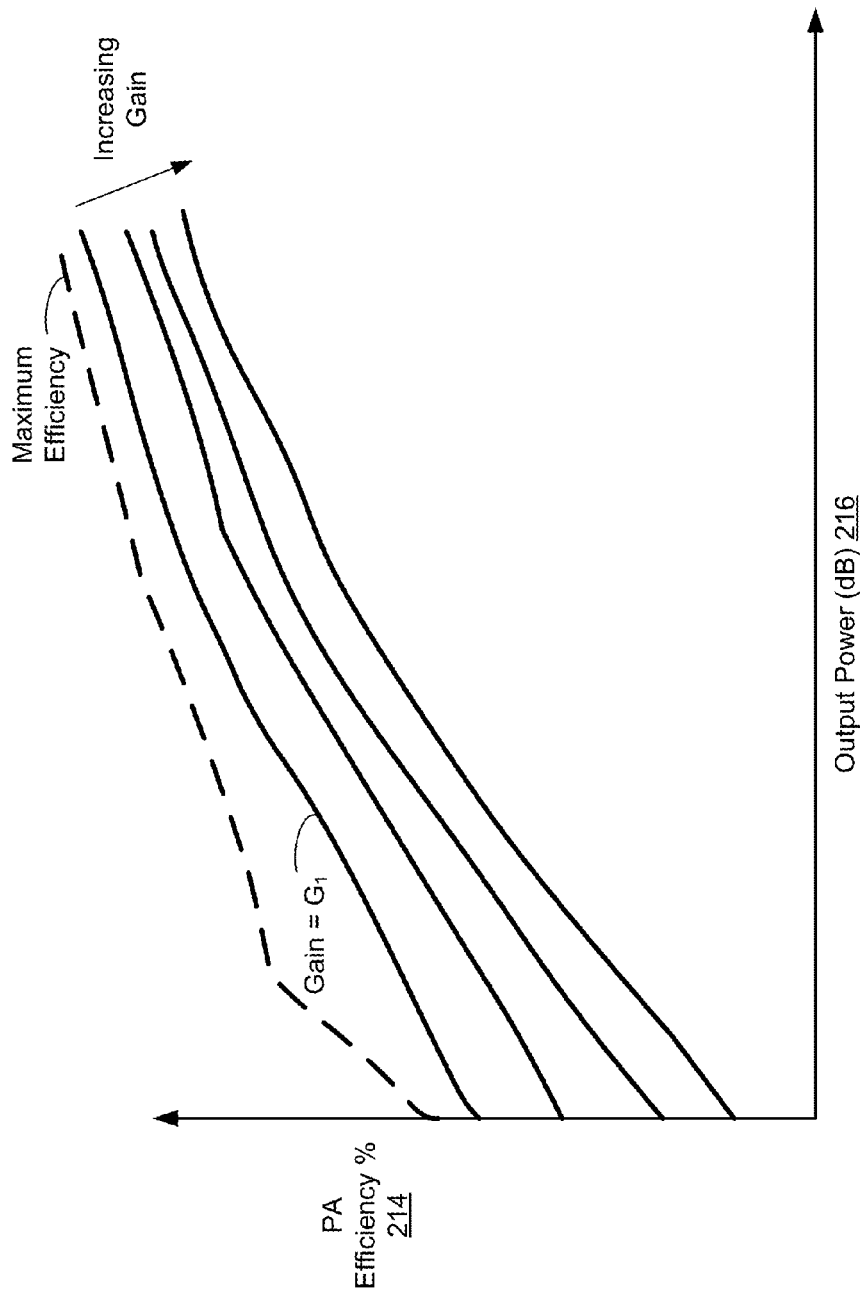
FIG. 2 is a plot illustrating the relationship between power efficiency and output power for different constant gains of the example power amplifier in accordance with one embodiment.

FIG. 2 illustrates the relationship between power efficiency 214 and output power 216 for different constant gain curves of the example power amplifier. The maximum efficiency 214 that the example power amplifier can achieve for any given output power 216 is also illustrated by the dashed line curve. As can be seen, different constant gain curves achieve different power efficiencies and an appropriately selected constant gain curve (e.g., gain curve $G_1$ in FIG. 2) will closely approximate the maximum efficiency curve while maintaining good linearity.

As can be seen from FIG. 2, a self-generated set point for a supply voltage of a power amplifier can be generated that will achieve both good linearity and power efficiency by controlling the power supply to operate along a constant gain curve (e.g., gain curve $G_1$) that approximates the maximum power efficiency curve. Under these operating conditions, the supply voltage is controlled to be approximately proportional to the delivered supply current to achieve the constant gain, as shown in FIG. 1. Thus, the output impedance of the power supply is negative because the power supply increases the output voltage as the delivered supply current increases. This is in contrast to conventional power supplies, which typically have near zero output impedance, such that the output voltage is approximately constant no matter how much supply current is delivered.

Figure 3:
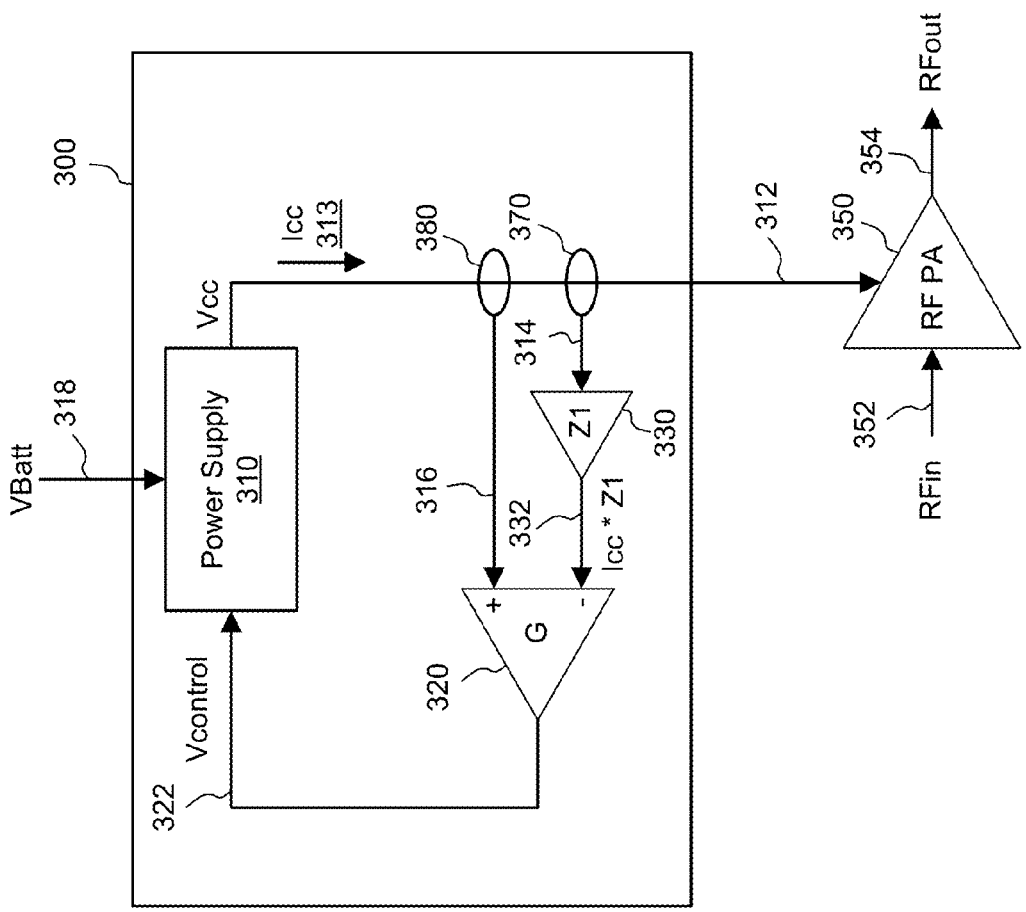
FIG. 3 is a circuit diagram illustrating a first embodiment of a self-setting power supply.

FIG. 3 illustrates an embodiment of a self setting power supply circuit 300 that operates with negative output impedance by maintaining an approximately proportional relationship between supply current and supply voltage. In FIG. 3, a self setting power supply 300 supplies a voltage 312 and current 313 to RF power amplifier 350. The RF power amplifier 350 receives an input signal 352 and generates an amplified output signal 354 based in part of the supply voltage 312.

Self setting power supply 300 comprises a power supply 310, an amplifier 330 (e.g., a single ended amplifier), a differential amplifier 320, current sensor 370, and voltage sensor 380. Power supply 310 supplies power to power amplifier 350 by providing a regulated supply voltage (Vcc) 312 and a supply current (Icc) 313, which is the current needed to maintain the supply voltage 312 at the controlled value. Power supply 310 controls the supply voltage 312 based on an input battery voltage (Vbatt) 318 and voltage control signal (Vcontrol) 322. Voltage sensor 380 (e.g., a voltage divider circuit) senses supply voltage 312 and generates a sensed voltage signal 316 representative of supply voltage 312. For example, in one embodiment, sensed voltage signal 316 comprises a signal having a voltage proportional to supply voltage 312. Current sensor 370 (e.g., a current sense resistor circuit) senses supply current 313 and generates sensed current signal 314 representing supply current 313. For example, in one embodiment, sensed current signal 314 comprises a signal having a voltage proportional to supply current 313.

In a feedback loop, an amplifier 330 (or multiplier) applies a gain Z1 to sensed current signal 314, thereby producing amplified current sense signal 332 representing Icc·Z1. Amplified current sense signal 332 is coupled to a negative input terminal of differential amplifier 320. Differential amplifier 320 amplifies the difference between voltage sense signal 316 and amplified current sense signal 332 according to a gain G of the differential amplifier 320 to produce power supply control signal (Vcontrol) 322. Power supply 310 adjusts supply voltage 312 based on power supply control signal 322. For example, power supply 310 increases supply voltage 312 in response to power supply control signal 322 increasing and power supply 310 decreases supply voltage 312 in response to power supply control signal 322 decreasing.

Assuming the gain G of differential amplifier 320 is very large (e.g., large enough to be approximated by infinity), the feedback loop will operate to maintain signals 316, 332 at the inputs to amplifier 320 at approximately the same value. Thus, power supply control signal 322 will control power supply 310 to increase supply voltage 312 when VCC<Icc·Z1 and will control power supply 310 to decrease supply voltage 312 when VCC>Icc·Z1. Supply voltage 312 will therefore stabilize at VCC=Icc·Z1 based on the negative feedback loop control. The output impedance of power supply 310 is given by $$Z_{out} = \Delta Vcc/-\Delta Icc = -Z1 \qquad (1)$$

Thus, power supply 310 effectively operates with a negative output impedance enabling it to achieve a constant gain by varying supply voltage 312 proportionally to supply current 313. The desired gain level can be configured experimentally or based on known characteristics of power amplifier 350 to select a gain that best approximates the maximum efficiency curve. The gain is related to the value of Z1, and particularly, the gain increases with increasing Z1. Thus, Z1 can be varied to achieve the desired gain. In alternative embodiments, additional circuit components may be used to further control the gain and its relationship to supply voltage 312 and supply current 313. For example, in one embodiment, a first (input) stage of power amplifier 350 can have a gain that varies with supply voltage 312.

Figure 4:
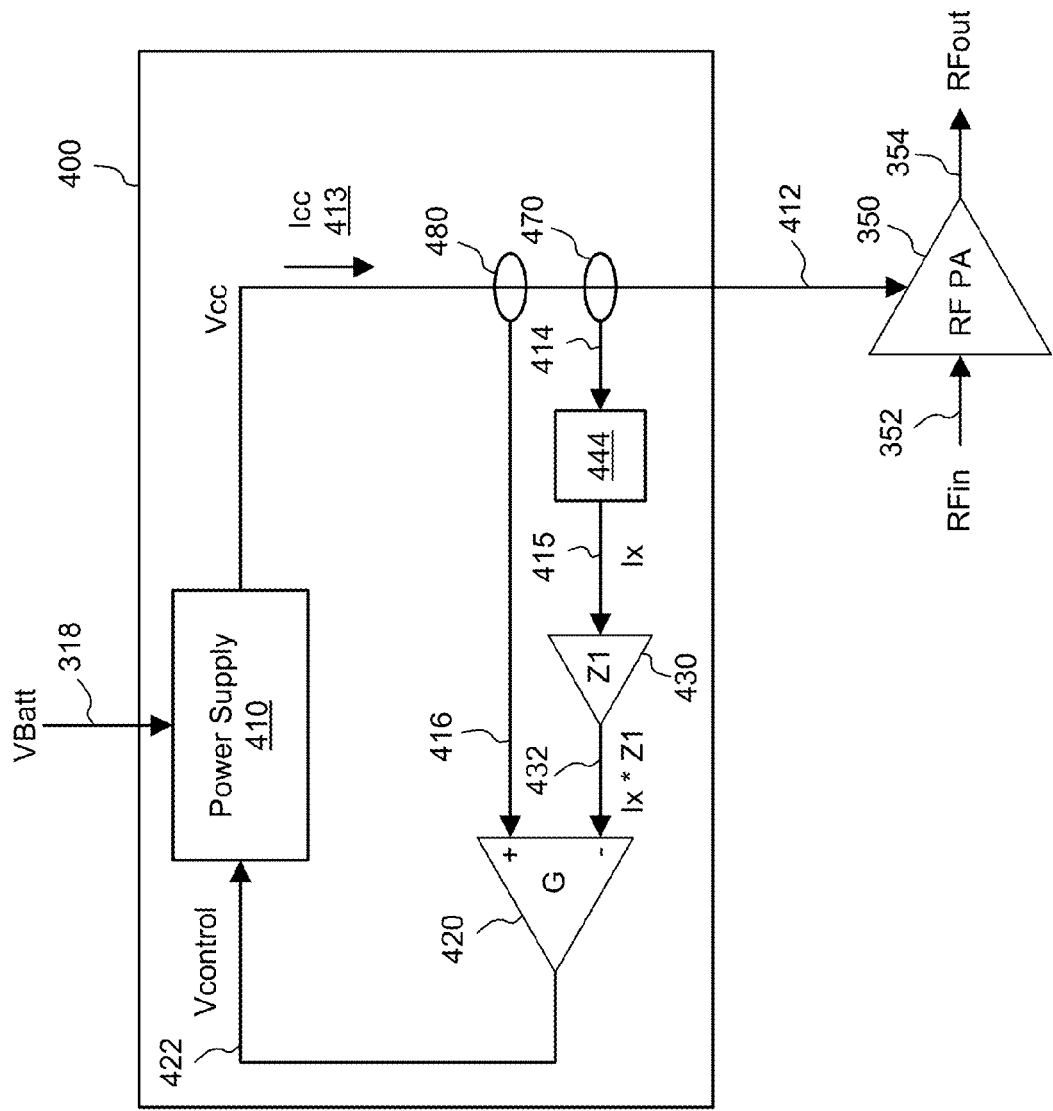
FIG. 4 is a circuit diagram illustrating a second embodiment of a self-setting power supply.

FIG. 4 illustrates an alternative embodiment of a self-setting power supply 400 that produces a supply voltage 412 and supply current 413 to power amplifier 350. Self setting power supply 400 comprises a power supply 410, an amplifier 430, a differential amplifier 420, current sensor 470, and voltage sensor 480, which operate similarly to the power supply 310, amplifier 330, differential amplifier 320, current sensor 370, and voltage sensor 380 respectively discussed above. Power supply 400 differs from power supply 300 in that sensed current signal 414 is provided to transformation block 444, which in turn produces transformed signal 415 (Ix) coupled to differential amplifier 430. In one embodiment, transformation block 444 performs the following function:

$$Ix = \frac{Vmin}{Z1} \text{ if } Icc < Imin \qquad (2)$$

$$Ix = Icc - Imin + \frac{Vmin}{Z1} \text{ if } Icc \geq Imin$$

where Vmin represents a predefined minimum operating voltage of power amplifier 350 and Imin represents a threshold bias current for power amplifier 350 to operate with Vcc=Vmin at a given gain level. Amplifier 430 receives transformed signal 415 (Ix) and applies a gain Z1 to produce amplified signal 432. Differential amplifier 420 amplifies a difference between amplified signal 432 and sensed voltage signal 416 to produce voltage control signal 422 to control the voltage of power supply 410, in a manner similar to that of self setting power supply 300 described above.

Figure 5:
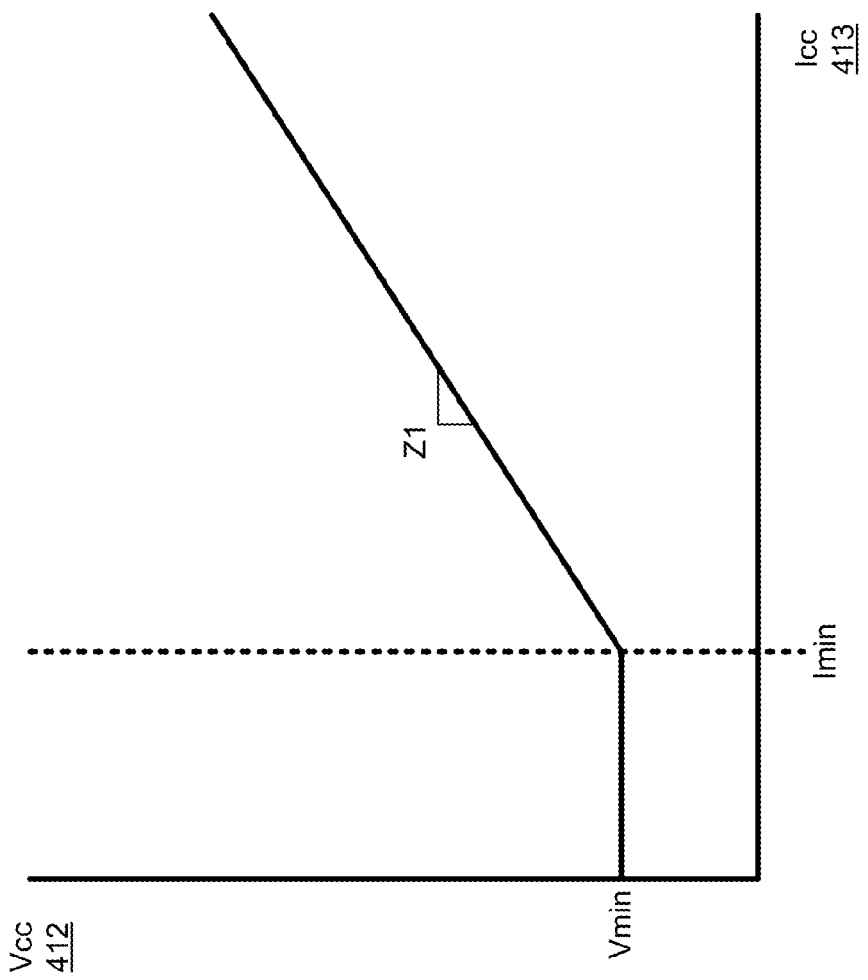
FIG. 5 is a plot illustrating the relationship between supply voltage and supply current for an example embodiment of a self-setting power supply.

FIG. 5 is a plot of supply current 413 and supply voltage 412 in accordance an embodiment of a self setting power supply 400. As illustrated in FIG. 5 and consistent with the equations above, power supply voltage 412 will stabilize at $$Vcc = Ix * Z1 = \frac{V\min}{Z1} * Z1 = V\min \text{ when } Icc < I\min. \quad (3)$$

Otherwise, when Icc≥Imin, power supply voltage 412 will stabilize at $$Vcc = Ix * Z1 = \left(Icc - I\min + \frac{V\min}{Z1}\right) * Z1 = V\min + (Icc - I\min) * Z1. \quad (4)$$

In this case, Vcc has a slope of Z1 with an offset of Vmin for the portion of the curve where Icc≥Imin.

An advantage of the circuit of FIG. 4 is that self setting power supply circuit 400 always operates above the minimum operating voltage Vmin. When operating above Imin, self setting power supply circuit 400 sets supply voltage 414 proportionally to the detected supply current 413, thus maintaining substantially constant gain and achieving efficient power operation. When operating with a supply current Icc<Imin, some gain change of power amplifier 350 may occur due to the discontinuity. However, this gain change will be relatively small and can be compensated for using standard RF distortion techniques.

Figure 6:
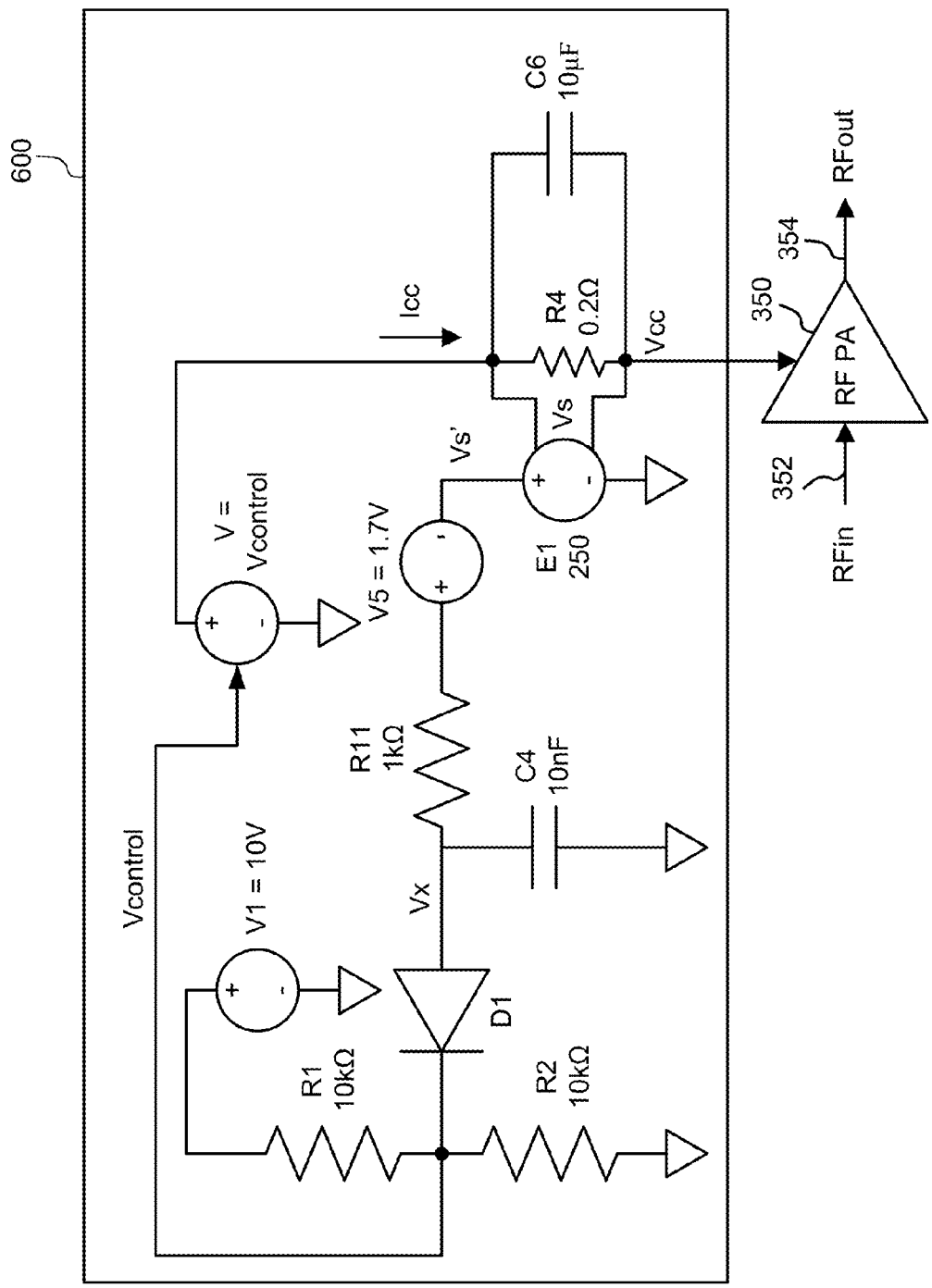
FIG. 6 is a circuit diagram illustrating an example implementation of an embodiment of a self-setting power supply.

FIG. 6 is a circuit diagram illustrating an example implementation of a self setting power supply circuit 600. Resistors R1, R2 and voltage source V1 control the minimum operating voltage Vmin. When diode D1 is off, Vcontrol is controlled by voltage source V1 and a voltage divider comprising resistors R1 and R2 as follows:

$$Vcontrol = V1 \cdot \frac{R2}{R1 + R2} = V\min \quad (5)$$

Thus, when diode D1 is off, Vcontrol sets Vcc to the minimum operational voltage Vmin.

Supply current Icc produces a sensed voltage Vs given by:

$$Vs = R4 \cdot Icc \quad (6)$$

E1 is a voltage controlled voltage source that scales sensed voltage Vs representing supply current to produce a scaled sensed voltage:

$$Vs' = E1 \cdot Vs = E1 \cdot R4 \cdot Icc \quad (7)$$

where E1 is a scaling factor. Voltage source V5 adds an additional fixed voltage to produce a voltage:

$$Vx = Vs' + V5 = E1 \cdot R4 \cdot Icc + V5 \quad (8)$$

Diode D1 will turn on when Vx>Vmin+Vth, where Vth is the turn on threshold of diode D1. Solving the equations above for the supply current Icc, diode D1 will turn on when:

$$Icc > \frac{V\min + Vth - V5}{E1 \cdot R4} = I\min \quad (9)$$

Furthermore, once diode D1 turns on, Vcontrol will be controlled as:

$$Vcontrol = Vx - Vth = V\min + Z1(Icc - I\min) \quad (10)$$

where Z1=E1·R1.

Thus, the circuit operates similarly to the circuit of FIG. 4 described by equations (2)-(4) above. Using the example component values illustrated in FIG. 6, the circuit will operate with Vmin=5V, Imin=80 mA. The component values can be varied to achieve different desired operating characteristics.

Figure 7:
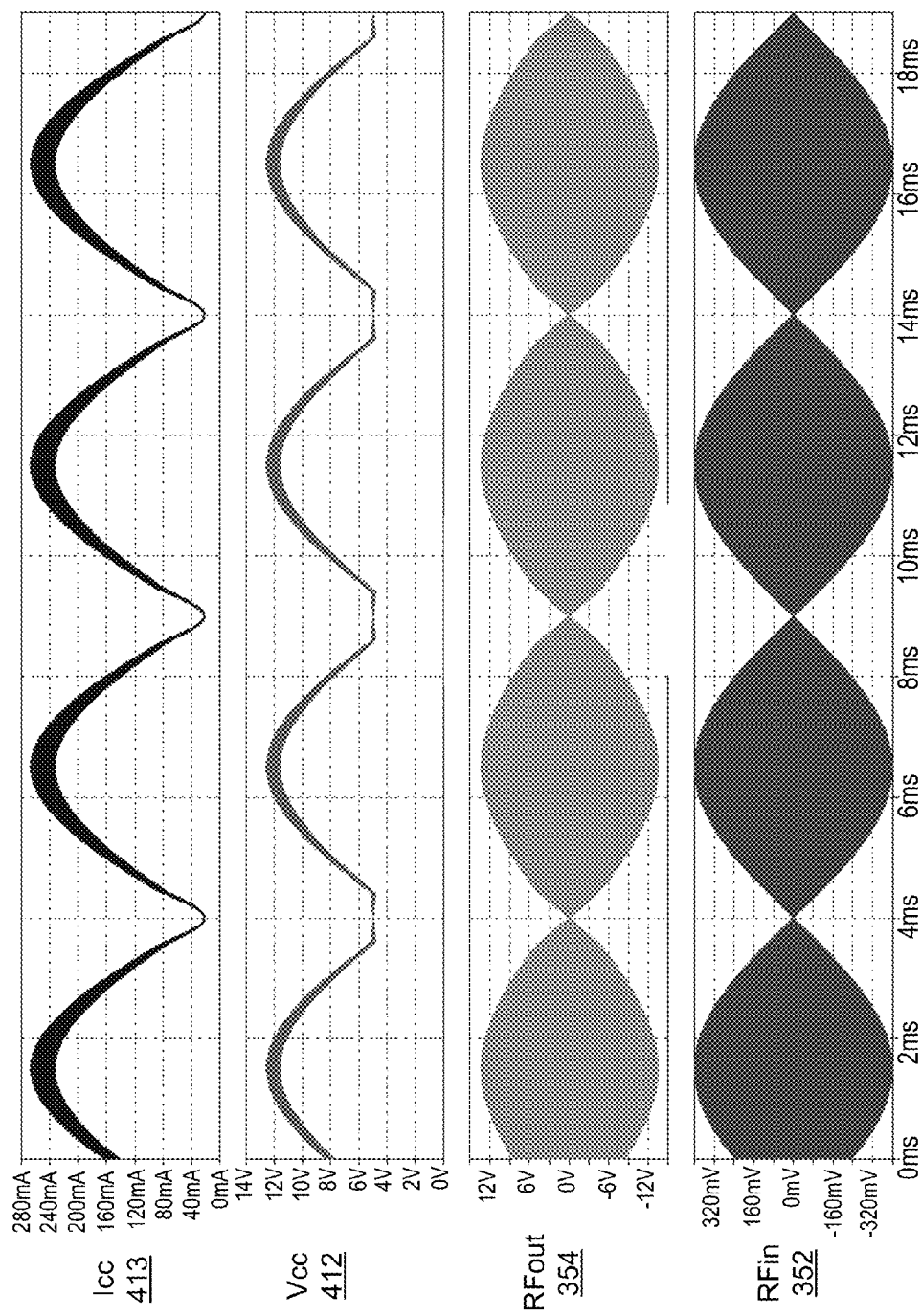
FIG. 7 illustrates example waveforms associated with operation of an example embodiment of a self-setting power supply.

FIG. 7 illustrates example waveforms associated with operation of an example self-setting power supply 400. As can be seen, supply voltage 412 varies approximately proportionally with supply current 413 above the threshold bias current Imin=80 mA for the given gain level. When supply current 413 drops below the threshold bias current Imin=80 mA, supply voltage 412 is set to Vcc=Vmin=5V. The gain of power amplifier 350 given by $RF_{out}/RF_{in}$ is approximately constant when Icc>Imin. The gain changes slightly when Icc drops below Imin which may result in some distortion at RFout 354. However, as described above, this distortion can be compensated for using various known distortion compensation techniques.

Upon reading this disclosure, those of skill in the art will appreciate still additional alternative designs for a self setting power supply. For example, in one alternative embodiment, the self-setting power supply 300 of FIG. 3, the self-setting power supply 400 of FIG. 4, or the self-setting power supply 600 of FIG. 6 can be used to provide power to an application processor or other electronic device that is not necessarily a power amplifier. In one embodiment, a self-setting power supply receives a voltage control signal and provides a supply voltage and a supply current to an electronic device (e.g., an application processor or other electronic device) based on the voltage control signal. The voltage control signal causes the power supply to increase the supply voltage responsive to detecting an increase in supply current and the power supply causes the power supply to decrease the supply voltage responsive to detecting a decrease in the supply current. In one embodiment, the power supply provides a constant (or substantially constant) supply voltage when the supply current is below a threshold and adjusts the supply voltage in response to the supply current as described above only when the supply current is below the threshold. The power supply for providing power to the application processor or other electronic device may have an architecture similar or identical to that of power supply 300, power supply 400, or power supply 600 described above.

Thus, while particular embodiments and applications have been illustrated and described, it is to be understood that the embodiments discussed herein are not limited to the precise construction and components disclosed herein and that various modifications, changes and variations which will be apparent to those skilled in the art may be made in the arrangement, operation and details of the method and apparatus disclosed herein without departing from the spirit and scope of the disclosure.

The invention claimed is:

1. A power amplifier system comprising:
a power amplifier to amplify a radio frequency (RF) input signal, generate an RF output signal, receive a supply voltage, and draw a supply current based on an amplitude of the RF output signal;
a power supply to provide the supply voltage and the supply current to the power amplifier based on a voltage control signal, the voltage control signal controlling the power supply to increase the supply voltage responsive to detecting an increase in the supply current when the supply current is above a predefined threshold current and to decrease the supply voltage responsive to detecting a decrease in the supply current when the supply current is above the predefined threshold current, the power supply including a voltage detection circuit to generate a sensed voltage signal representative of the supply voltage, a current detection circuit to generate a sensed current signal representative of the supply current, an amplifier to apply a gain to the sensed current signal to generate an amplified current signal, and a differential amplifier to generate the voltage control signal based on a first difference between the amplified current signal and the sensed voltage signal.

2. The power amplifier system of claim 1 wherein the power supply is configured to output a predefined minimum voltage as the supply voltage responsive to detecting that the supply current is below the predefined threshold current.

3. The power amplifier of claim 2 wherein the power supply further includes a transformation block coupled between the current detection circuit and the amplifier, the transformation block configured to generate a transformed signal having a substantially constant value when the sensed current signal indicates that the supply current is below the predefined threshold current and being a function of the sensed current signal when the sensed current signal indicates that the supply current is above the predefined threshold current.

4. The power amplifier system of claim 3 wherein the substantially constant value includes a predefined threshold voltage scaled by a gain factor, the predefined threshold voltage corresponding to the supply voltage when the supply current is substantially equal to the predefined threshold current.

5. The power amplifier system of claim 3 wherein the power supply is configured to determine a second difference between the sensed current signal and the predefined threshold current and generate the transformed signal based on the second difference when the sensed current signal indicates that the supply current is above the predefined threshold current.

6. The power amplifier system of claim 1 wherein the power supply operates with a substantially constant gain when the supply current is above the predefined threshold current.

7. The power amplifier system of claim 1 wherein the power supply operates with a negative output impedance.

8. A method for generating an RF output signal based on an RF input signal in a power amplifier system, the method comprising:
receiving, by a power amplifier, a supply voltage and the RF input signal;
amplifying, by the power amplifier, the RF input signal to generate the RF output signal, the power amplifier drawing a supply current based on an amplitude of the RF output signal;
generating, by a power supply, a sensed voltage signal representative of the supply voltage and a sensed current signal representative of the supply current;
applying, by the power supply, a gain to the sensed current signal to generate an amplified current signal;
generating, by the power supply, a voltage control signal based on a first difference between the amplified current signal and the sensed voltage signal;
providing, by the power supply, the supply voltage and the supply current to the power amplifier based on the voltage control signal; and
controlling the power supply to increase the supply voltage responsive to detecting an increase in the supply current when the supply current is above a predefined threshold current and to decrease the supply voltage responsive to detecting a decrease in the supply current when the supply current is above the predefined threshold current.

9. The method of claim 8 further comprising outputting a predefined minimum voltage as the supply voltage responsive to detecting that the supply current is below the predefined threshold current.

10. The method of claim 9 further comprising generating a transformed signal based on the current sense signal, the transformed signal having a substantially constant value when the sensed current signal indicates that the supply current is below the predefined threshold current and being a function of the sensed current signal when the sensed current signal indicates that the supply current is above the predefined threshold current.

11. The method of claim 10 wherein the substantially constant value includes a predefined threshold voltage scaled by a gain factor, the predefined threshold voltage corresponding to the supply voltage when the supply current is substantially equal to the predefined threshold current.

12. The method of claim 10 wherein generating the transformed signal based on the current sense signal includes determining a second difference between the sensed current signal and the predefined threshold current and generating the transformed signal based on the second difference when the sensed current signal indicates that the supply current is above the predefined threshold current.

13. The method of claim 8 further comprising operating the power supply with a substantially constant gain when the supply current is above the predefined threshold supply current.

14. The method of claim 8 further comprising operating the power supply with a negative output impedance.

15. A power supply for a power amplifier system, the power supply comprising:
a voltage detection circuit to generate a sensed voltage signal representative of a supply voltage to a power amplifier;
a current detection circuit to generate a sensed current signal representative of a supply current to the power amplifier;
an amplifier coupled to the current detection circuit to apply a gain to the sensed current signal to generate an amplified current signal;
a differential amplifier coupled to the amplifier and the voltage detection circuit, the differential amplifier configured to generate a voltage control signal based on a difference between the amplified current signal and the sensed voltage signal; and
a variable power supply coupled to the differential amplifier, the variable power supply configured to control the supply voltage to the power amplifier based on the voltage control signal, the voltage control signal controlling the variable power supply to increase the supply voltage responsive to detecting an increase in the supply current when the supply current is above a predefined threshold current and to decrease the supply voltage responsive to detecting a decrease in the supply current when the supply current is above the predefined threshold current.

16. The power supply of claim 15 wherein the variable power supply is configured to output a predefined minimum voltage as the supply voltage responsive to detecting that the supply current is below the predefined threshold current.

17. The power supply of claim 15 wherein the power supply operates with a substantially constant gain when the supply current is above the predefined threshold current.

18. The power supply of claim 15 wherein the power supply operates with a negative output impedance.

19. The method of claim 10 wherein generating the voltage control signal includes generating the voltage control signal based on a third difference between the transformed signal and the sensed voltage signal.

* * * * *